United States Patent [19]

Takenaka

[11] Patent Number: 4,860,198
[45] Date of Patent: Aug. 22, 1989

[54] MICROPROCESSOR SYSTEM

[75] Inventor: Tsutomu Takenaka, Tokyo, Japan

[73] Assignee: Kabushiki Kaisha Toshiba, Kawasaki, Japan

[21] Appl. No.: 196,752

[22] Filed: May 17, 1988

Related U.S. Application Data

[63] Continuation of Ser. No. 780,291, Sep. 26, 1985, abandoned.

[30] Foreign Application Priority Data

Jan. 31, 1985 [JP] Japan .................................. 60-16777

[51] Int. Cl.$^4$ .......................... G06F 13/00; G06F 7/00
[52] U.S. Cl. .................................... 364/200; 364/400; 364/402; 364/407
[58] Field of Search ... 364/200 MS File, 900 MS File

[56] References Cited

U.S. PATENT DOCUMENTS

| | | | |
|---|---|---|---|
| 4,213,177 | 7/1980 | Schmidt | 364/200 |
| 4,237,543 | 12/1980 | Nishio et al. | 364/900 |
| 4,286,321 | 8/1981 | Baker et al. | 364/200 |
| 4,371,928 | 2/1983 | Barlow et al. | 364/200 |
| 4,447,878 | 5/1984 | Kinnie et al. | 364/200 |
| 4,467,447 | 8/1984 | Takahashi et al. | 364/900 |
| 4,534,011 | 8/1985 | Andrews et al. | 364/900 |
| 4,554,627 | 11/1985 | Holland et al. | 364/200 |
| 4,580,213 | 4/1986 | Hulett et al. | 364/200 |

FOREIGN PATENT DOCUMENTS 0189638  8/1986  European Pat. Off. .
2021823  12/1979  United Kingdom .

OTHER PUBLICATIONS

Microprocessor and Peripherals Handbook Inte, pp. 3-1-3-24 (1983).
Kalish et al., "Consider Using the S-100 Bus to Host Your 16-bit Microprocessor", published Aug. 9, 1984 in Electrical Design News, vol. 29, No. 16, pp. 199-206, Boston, Mass.
Young et al., "Mixing Data Paths Expands Options in System Design", published Jan. 1985 in Computer Design, vol. 24, No. 1, pp. 187-194, 196 and 198, Littleton, Mass.

Primary Examiner—David Y. Eng
Attorney, Agent, or Firm—Finnegan, Henderson, Farabow, Garrett & Dunner

[57] ABSTRACT

A microprocessor system is configured by connecting an n/2-bit memory and/or I/O to an n-bit microprocessor. The system has a read/write controller for enabling/disabling a read/write control signal for accessing the memory and/or I/O, an address latch counter for latching and updating the address, a bus converter for converting the data bus through which the data is transferred, and a timing generator. The timing generator comprises a detector for detecting that the instruction executed by the microprocessor is a word transfer instruction for the memory and/or I/O, a counter for counting the number of times a read/write control signal is generated and a timing controller for generating various timing control signals when the word transfer instruction for the memory and/or I/O is executed. When the microprocessor performs the word transfer instruction for the memory and/or I/O, the read/write control signal is enabled and disabled to perform two access cycles. The word transfer instruction can be automatically converted to two ½ transfer instructions.

20 Claims, 9 Drawing Sheets

F I G. 4
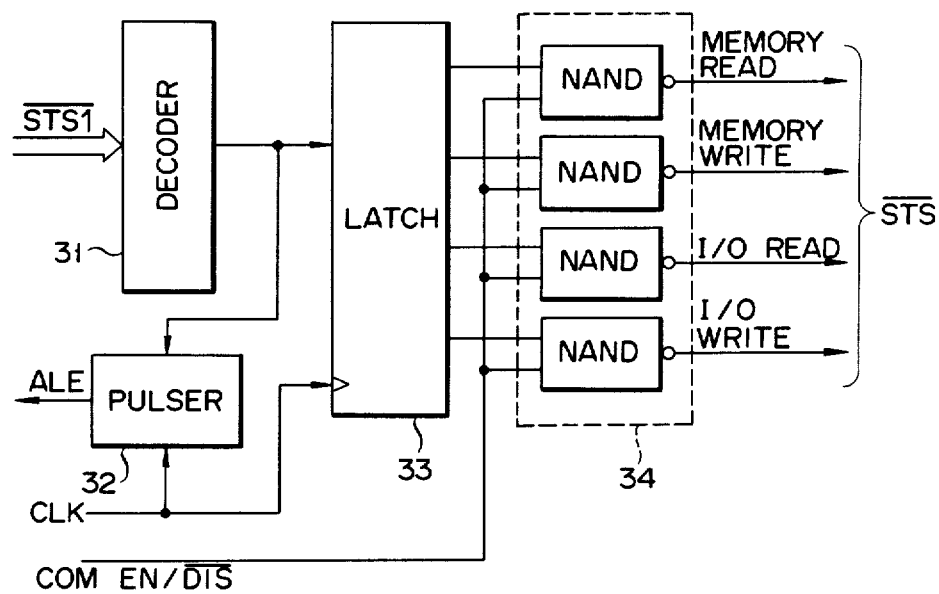
F I G. 5
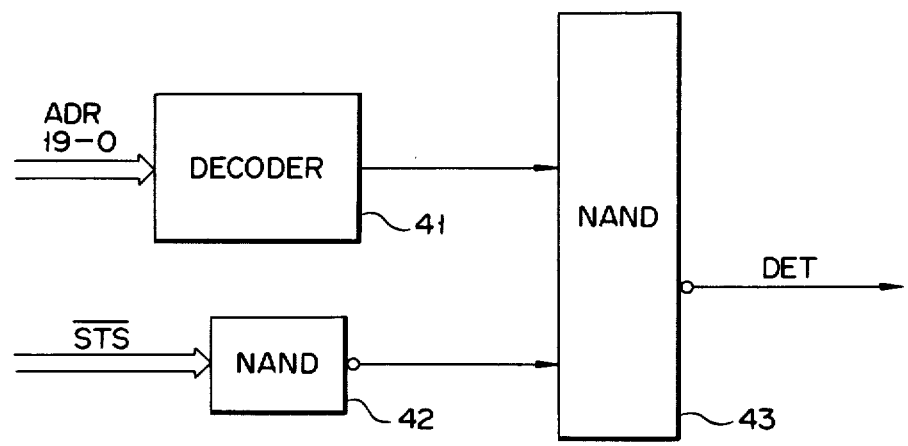

F I G. 6
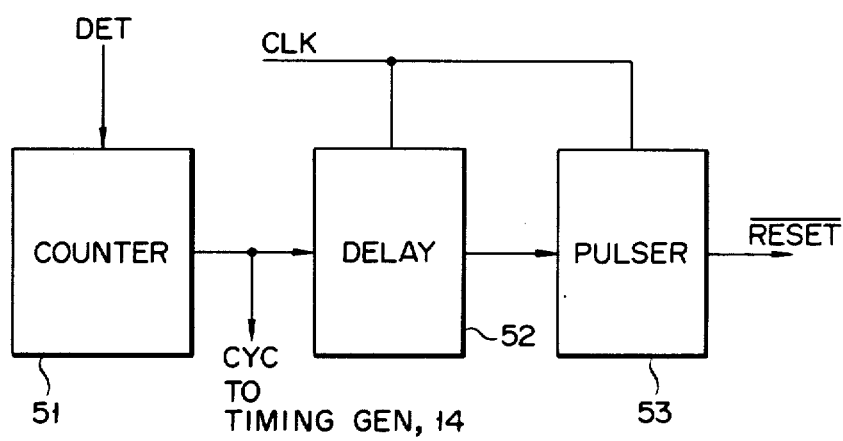
F I G. 7
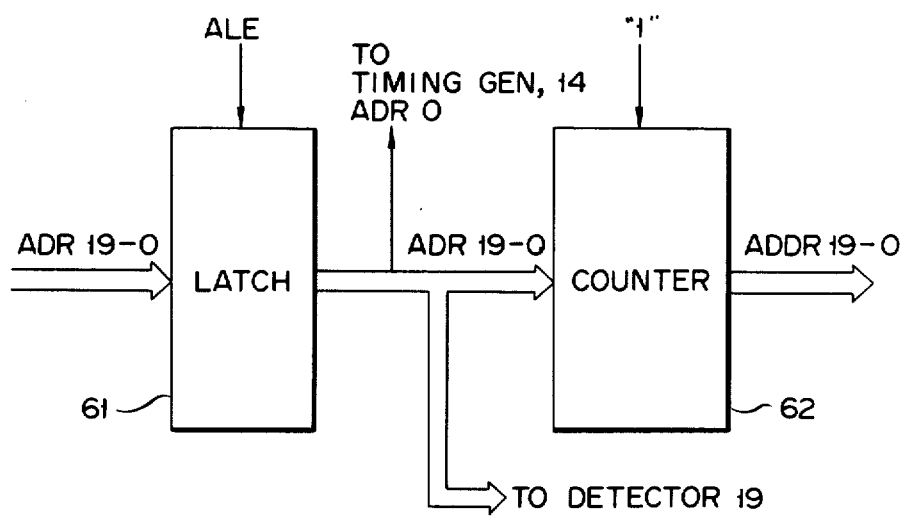

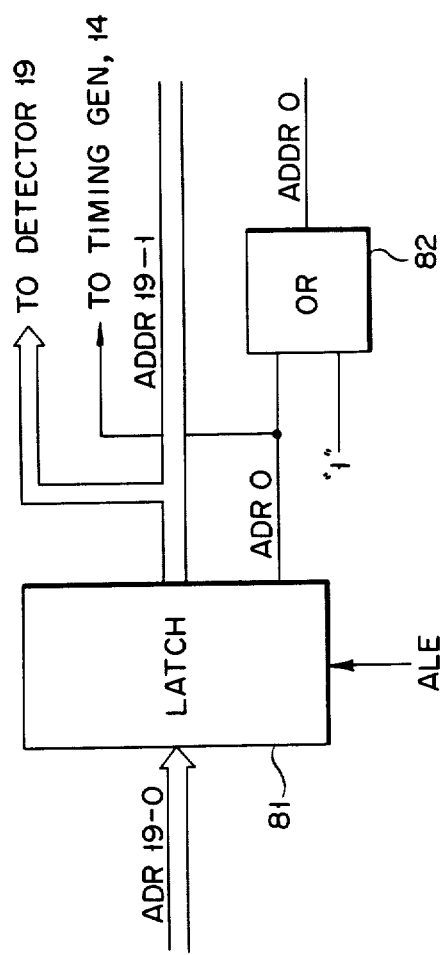
F I G. 12

MICROPROCESSOR SYSTEM

This application is a continuation of application Ser. No. 780,291 filed Sept. 26, 1985, now abandoned.

BACKGROUND OF THE INVENTION

The present invention relates to a microprocessor system configured by connecting a memory and/or I/O having an n/2-bit data bus width to a microprocessor having an n-bit data bus width.

Semiconductor technology has developed in recent years to allow creation of a high-performance computer system through a combination of a microprocessor and its peripheral control LSIs (DMA controller, etc.) and has developed to the extent that computer systems can be designed with ease. Furthermore, 8-bit microprocessors are gradually being replaced with 16- and 32-bit microprocessors, and microprocessor capability has been reinforced. However, most currently available peripheral control LSIs are operated on an 8-bit operation basis. For example, when a 16-bit microprocessor controls a peripheral control LSI with an 8-bit data bus width, two byte transfer instructions are used in place of one word transfer instruction. In this manner, a programmer must create a program by considering combinations of the architecture of the system executable instructions (1-/2-/4-byte access instructions or the like). Since a word transfer instruction cannot be used in the 8-bit peripheral control LSI, existing software for 16-microprocessors must be rewritten such that a 16-bit word instruction is replaced with two byte transfer instructions.

The prior art will be described hereinafter. FIG. 1 is a block diagram of a conventional microprocessor system. The system comprises a microprocessor ($\mu$CPU 8086) 1, a bus controller (BUS CTRLR) 2, a latch (LATCH) 3, a bus transceiver (TRANSCEIVER) 4, a memory and/or I/O (MEMORY AND/OR I/O) (to be referred to as a memory hereinafter) 5 having a 16-bit data bus width, and a system bus 6. The microprocessor 1 comprises, for example, a microprocessor 8086 available from Intel Corp., U.S.A. The microprocessor 1 receives a clock CLK and sends status data STS1 to the controller 2. Upon reception of the data STS1, the controller 2 supplies a read/write control signal $\overline{STS}$ to the memory 5 or the like.

The microprocessor 1 is connected to the latch 3 and the transceiver 4 through an address data bus ADR/DAT. The microprocessor 1 supplies an address signal to the latch 3 and a data signal to the transceiver 4. The latch 3 receives the address signal from the microprocessor and supplies an address ADDR to the memory 5. The transceiver 4 is connected to the memory through a data bus DATA and the bus 6 and transfers data from or to the memory 5. The controller 2 supplies a signal ALE to the latch 3 and a signal BDCTL to the transceiver 4. The signal ALE controls a latch timing of the address, and the signal BDCTL controls the input/output of the transceiver 4.

The operation of the microprocessor system will be described. FIGS. 2A to 2E are timing charts explaining a read cycle word transfer instruction starting from an even address in the circuit of FIG. 1. The machine cycle basically consists of clocks (CLK) T1, T2, T3 and T4, as shown in FIG. 2A. In the read cycle starting from the even address, the microprocessor 1 generates the address and the status data in response to the clock T1, as shown in FIG. 2B. The controller 2 supplies the signal ALE to the latch 3 in response to the status data, as shown in FIG. 2D. The controller 2 supplies the signal $\overline{STS}$ to the memory 5, as shown in FIG. 2C. The latch 3 latches the address in response to the signal ALE generated from the controller 2. Data of 16 bits is read out from the memory 5 onto the bus DATA, and the transceiver 4 sends the 16-bit data shown in FIG. 2B from the memory 5 onto the bus ADR/DAT by the control signal BDCTL shown in FIG. 2E from the bus controller 2.

The microprocessor 1 fetches the data at the trailing edge of the clock T3. In the word transfer instruction of the read cycle starting from an odd address, there are two access cycles. Data fetching is performed in the same manner as in the read cycle starting from an even address. However, in the first access cycle, the data corresponding to the start odd address is fetched as the most significant part of the 16-bit data. The address is then updated, and in the second access cycle, the data corresponding to an even address next to the start odd address is fetched as the least significant part. In this manner, 16-bit data is thus fetched by the microprocessor 1.

The above operation can be performed in the same manner as in the word transfer instruction of the write cycle. As is apparent from the above description, the prior art microprocessor system has a 16-byte boundary. Although one address has 1-byte data, the address has, as its objective, a memory of basically a 16-bit data bus switch. For this reason, the microprocessor system configuration is not flexible, resulting in inconvenience (see MEMORY ORGANIZATION of MICROPROCESSOR AND PERIPHERALS HANDBOOK 1983 published by Intel Corp. for further reference).

SUMMARY OF THE INVENTION

The present invention has been made in consideration of the drawback inherent in the conventional systems and described above, and has as its object to provide a microprocessor system that can automatically convert a word transfer instruction to two byte transfer instructions.

In order to achieve the above object of the present invention, there is provided a microprocessor system to convert one word transfer instruction into two ½ word transfer instruction comprising:

microprocessor having an n-bit data bus width;

memory and/or I/O having an n/2-bit data bus width;

read/write controller means for performing two access cycles by enabling or disabling generation of the read/write control signals from status data output by said microprocessor in response to a control signal;

address latch counter means for fetching the address from said microprocessor, for supplying the latched address to said memory and/or I/O, for updating address data in response to a control signal while generation of the read/write control signal is inhibited, and for supplying the updated address to said memory and/or I/O;

bus converter means, responsive to control signals and operating so as to divide n-bit data from said microprocessor into two n/2-bit data and to output the data to said memory and/or I/O by two access cycles according to the accessed address by the instruction in write cycle and so as to combine with two n/2-bit data from the accessed address in said memory and/or I/O by the instruction to form n-bit data and to output the data to said microprocessor in read cycle; and timing generator means for supplying control signals to said microprocessor, said read/write controller means, said address latch counter means, and said bus converter means.

The microprocessor system configured by connecting a memory and/or I/O with an n/2 bit data bus width to a microprocessor with an n bit data bus width converts a word transfer instruction into two ½-word transfer instruction with use of a method comprising:

the first step of extracting a read/write control signal for said memory and/or I/O from status data generated from said microprocessor when said microprocessor executes the word transfer instruction, supplying the read/write control signal together with an address to said memory and/or I/O, setting a bus converter for connecting a data bus coupled to said memory and/or I/O with a data bus coupled to said microprocessor to a state for accessing a memory and/or I/O with a n-bit data bus width, and starting a first access cycle;

the second step of performing the first access cycle for said memory and/or I/O;

the third step of updating the address and supplying the updated memory and/or I/O;

the fourth step of performing the second access cycle for said memory and/or I/O; and the fifth step of causing said microprocessor to inhibit generation of the read/write control signal to complete the word transfer instruction.

According to the microprocessor system of the present invention, a software programmer need not selectively use the word transfer instruction and the byte transfer instruction in accordance with the data bus width of the memory and/or I/O. In other words, the programmer can always use word transfer instructions.

BRIEF DESCRIPTION OF THE DRAWINGS

FIGS. 2A to 2E are timing charts explaining the read cycle starting from an even address in the system of FIG. 1, in which FIG. 2A shows a clock CLK, FIG. 2B shows a state of the address data bus ADR/DAT, FIG. 2C shows the read/write control signal $\overline{STS}$ generated from a bus controller 2, FIG. 2D shows an address latch control signal ALE generated from the controller 2, and FIG. 2E shows a signal BDCTL generated from the controller 2 to control the transceiver 4;

FIG. 4 is a detailed block diagram of a read/write controller in the system shown in FIG. 3;

FIG. 5 is a detailed block diagram of a detector in the system shown in FIG. 3;

FIG. 6 is a detailed block diagram of a counter in the system shown in FIG. 3;

FIG. 7 is a detailed block diagram of an address latch counter in the system shown in FIG. 3;

FIGS. 9A to 9T, FIGS. 10A to 10T and FIGS. 11A to 11T are timing charts explaining the word transfer instructions of read, write and read cycles starting from the even, even and odd addressed, respectively, in a microprocessor system configured by connecting a memory and/or I/O having an 8-bit data bus width to a 16-bit microprocessor, in which FIGS. 9A, 10A and 11A show clocks CLK, FIGS. 9B, 10B and 11B show status data $\overline{STS1}$ generated from the microprocessor, FIGS. 9C, 10C and 11C show signals COM EN/$\overline{DIS}$ for controlling generation of the read/write control signal, FIGS. 9D 10D and 11D show outputs $\overline{STS}$ of the read/write control signal, FIGS. 9E, 10E and 11E show states of an address data bus ADR/DAT 15-0, FIGS. 9F, 10F and 11F show states of an address bus ADDR 19-1, FIGS. 9G, 10G and 11G show states of an address bit ADDR0, FIGS. 9H, 10H and 11H show signals $\overline{WAIT}$ for controlling the waiting states of the microprocessor, FIGS. 9I, 10I, 11I show signals $\overline{RESET}$ for resetting the timing controller, FIGS. 9J, 10J and 11J show states of a data bus DATA 7-0, FIGS. 9K, 10K, and 11K show states of a data bus DATA 15-8, FIGS. 9L and 10L show outputs from a latch 74 while FIG. 11L shows an output from a latch 72, FIGS. 9M, 10M and 11M show signals BD1DIR for determining the output directions of a bidirectional bus driver 71, FIGS. 9N, 10N and 11N show signals $\overline{BD1EN}$ for inhibiting output generation of the driver 71, FIGS. 9O, 10O and 11O show signals BD2DIR for determining the output direction of a bidirectional bus driver 73, FIGS. 9P, 10P and 11P show signals $\overline{BD2EN}$ for enabling or disabling output generation of the driver 73, FIGS. 9Q, 10Q and 11Q show signals BD3DIR for determining the output direction of a bidirectional bus driver 75, FIGS. 9R, 10R and 11R show signals $\overline{BD3EN}$ for enabling/disabling output generation of the driver 75, FIGS. 9S and 10S show signals LT1CNT for controlling the latch timings of the latch 74 while FIG. 11S shows a signal LT2CNT for controlling a latch timing of the latch 72, and FIGS. 9T and 10T show signals $\overline{LT1EN}$ for controlling generation of data latched by the latch 74 while FIG. 11T shows a signal $\overline{LT2EN}$ for controlling generation of data latched by the latch 72; and FIG. 12 is a block diagram showing a modification of the address latch counter of FIG. 3.

DETAILED DESCRIPTION OF THE PREFERRED EMBODIMENT

The present invention will be described in detail with reference to a preferred embodiment.

Figure 1:
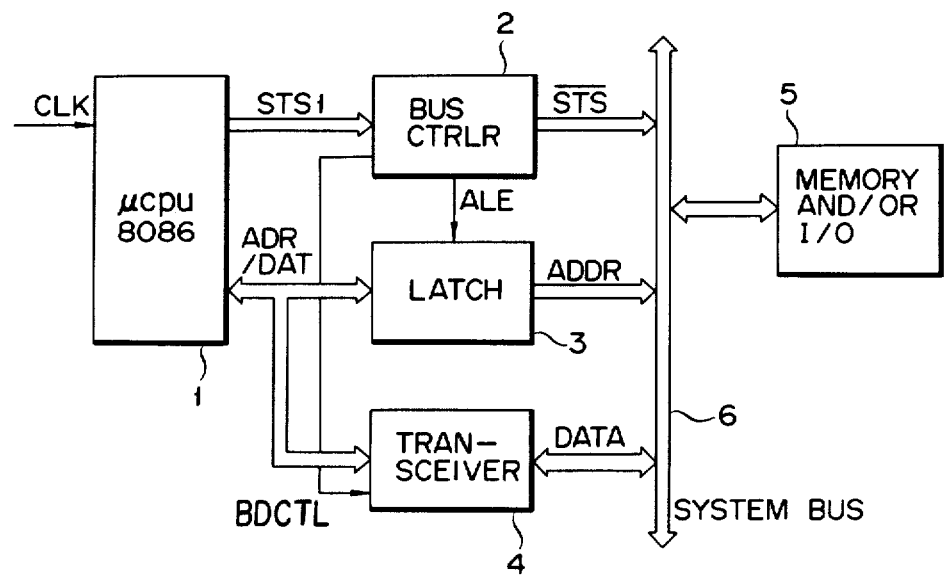
FIG. 1 is a block diagram of a microprocessor system of the prior art.
Figure 2:
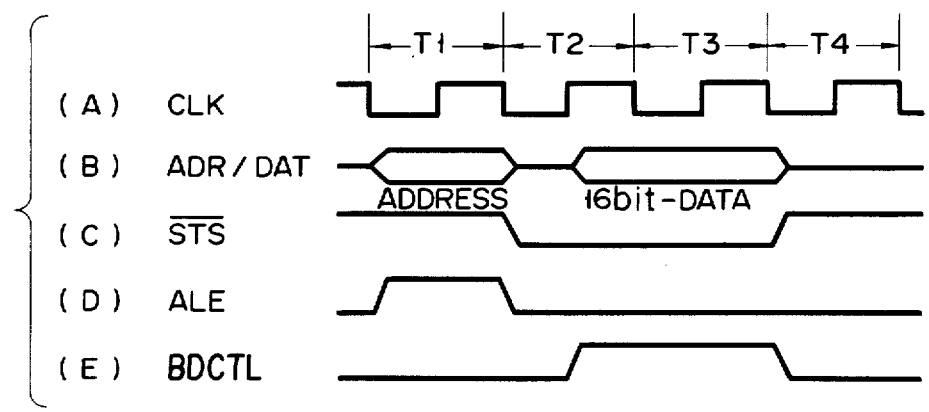
Figure 3:
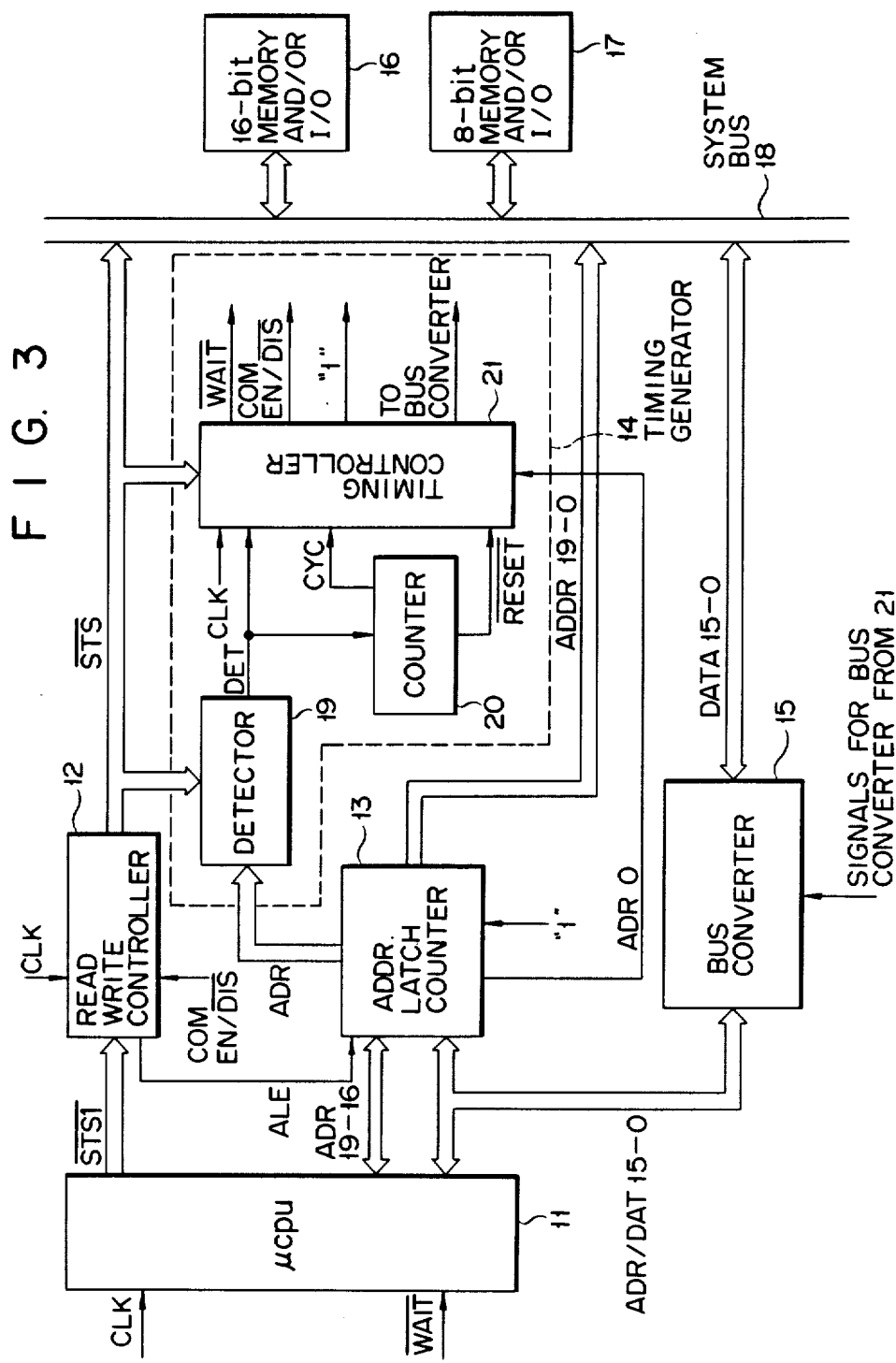
FIG. 3 is a block diagram of a microprocessor system according to an embodiment of the present invention.

FIG. 3 is a block diagram of a microprocessor system configured by connecting a memory and/or I/O 17 having an 8-bit data bus width to a 16-bit microprocessor 11.

At first the architecture of the system will be described with reference to FIG. 3. The microprocessor system comprises the microprocessor 11, a read/write controller 12, an address latch counter 13, a timing generator 14, a bus converter 15, a 16-bit memory and/or I/O 16, the 8-bit memory and/or I/O 17, and a system bus 18. The timing generator 14 comprises a detector 19, a counter 20, and a timing controller 21. The microprocessor 11 receives a clock CLK and a wait control signal $\overline{WAIT}$ from the controller 21 and supplies status data $\overline{STS1}$ to the controller 12 and an address ADR 19-0 to the counter 13.

The controller 12 comprises a decoder 31, a pulser 32, a latch 33 and a gate 34, as shown in FIG. 4. The decoder 31 decodes the status data $\overline{STS1}$ supplied from the microprocessor 11 and supplies the decoded data to the pulser 32 and the latch 33. The pulser 32 supplies an address latch enable signal ALE to the counter 13 in response to the clock CLK. The latch 33 latches the outputs from the decoder 31 in response to the clock CLK, and the latched data is supplied to the gate 34.

The gate 34 is controlled by the control signal COM EN/$\overline{\text{DIS}}$ from the controller 21, to be described later, and supplies to the detector 19 and the controller 21 a read/write control signal $\overline{\text{STS}}$ representing memory or I/O write or read mode. The gate 34 also supplies the read/write control signal $\overline{\text{STS}}$ to the memories and/or I/Os 16 and 17 through the bus 18.

The address latch counter 13 comprises a latch 61 and a counter 62, as shown in FIG. 7. The latch 61 latches the address ADR 19-0 from the microprocessor 11 in response to the signal ALE from the controller 12. An address ADR 19-0 is supplied to the counter 62 and the detector 19. The least significant bit ADR 0 of the address is supplied to the controller 21. The counter 62 receives, as a preset value, the output from the latch 61, supplies the received address to the memories and/or I/Os 16 and 17, and is counted up in response to a signal of logic "1" from the controller 21. The updated address data is supplied from the counter 62 to the memories and/or I/Os 16 and 17 through a bus ADDR 19-0 and the bus 18.

The detector 19 comprises a decoder 41 and gates 42 and 43, as shown in FIG. 5. The decoder 41 decodes the address data ADR 19-0 generated from the counter 13 and supplies the decoded result to the gate 43. The gate 42 calculates the NAND product of the read/write control signals $\overline{\text{STS}}$ as outputs from the controller 12 and supplies the NAND signal to the gate 43. The gate 43 also calculates the NAND product of the inputs. When an instruction executed by the microprocessor 11 is determined to be the word transfer instruction for the 8-bit memory and/or I/O 17, the gate 43 supplies a detection signal DET to the counter 20 and the controller 21.

The counter 20 comprises a counter 51, a delay 52 and a pulser 53, as shown in FIG. 6. The counter 51 counts the output signal DET from the detector 19. When the count of the counter 51 has reached "2", i.e., when the start of the second access cycle is represented, the counter 51 supplies a signal CYC to the controller 21 and the delay 52. The delay 52 receives the output from the counter 51 and the clock signal CLK. When a predetermined period of time has elapsed, the delay 52 supplies a signal to the pulser 53. The pulser 53 supplies a signal $\overline{\text{RESET}}$ to the controller 21 to reset the controller 21.

Figure 8:
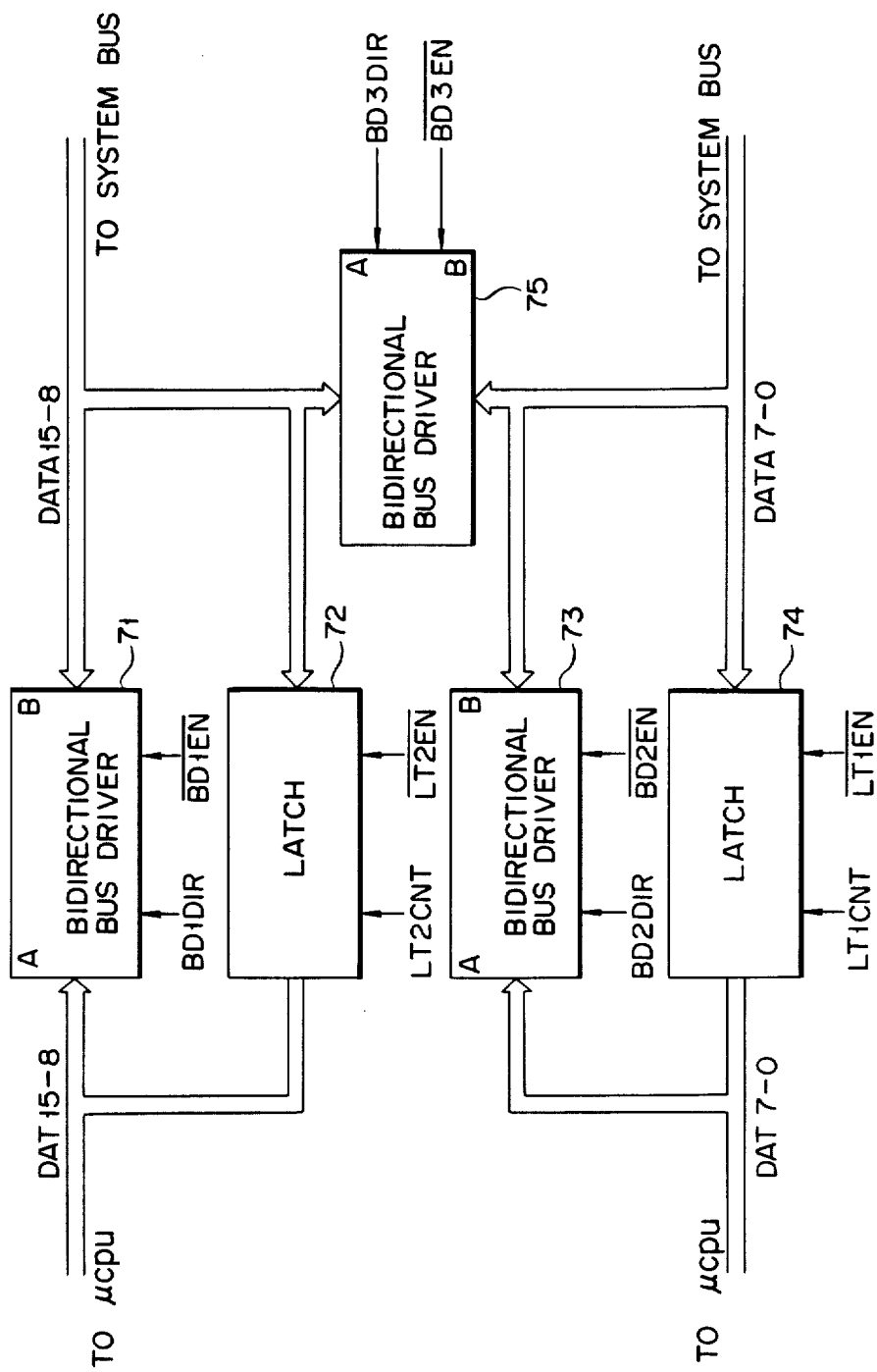
FIG. 8 is a detailed block diagram of a bus converter in the system shown in FIG. 3.

Referring to FIG. 3, the microprocessor 11 exchanges data with the converter 15 through a data bus DAT. As shown in FIG. 8, the converter 15 comprises bidirectional bus drivers 71, 73 and 75, and latches 72 and 74. A set of the driver 71 and the latch 72 and another set of the driver 73 and the latch 74 are connected in parallel between the data buses DAT 15-0 and DATA 15-8, and between the data buses DAT 7-0 and DATA 7-0. In this case, the latches 72 and 74 are connected to supply data to the microprocessor 11. The driver 75 is arranged to connect the bus DATA 15-8 to the bus DATA 7-0. The converter 15 receives from the controller 21 control signals $\overline{\text{BD1EN}}$ and BD1DIR for the driver 71, control signals $\overline{\text{BD2EN}}$ and BD2DIR for the driver 73, control signals $\overline{\text{BD3EN}}$ and BD3DIR for the driver 75, control signals LT2CNT and $\overline{\text{LT2EN}}$ for the latch 72, and control signals LT1CNT and $\overline{\text{LT1EN}}$ for the latch 74. The memories and/or I/Os 16 and 17 receive the signal $\overline{\text{STS}}$ and an address ADDR. A data bus DATA 15-0 is connected to the 16-bit memory and/or I/O 16, and the bus DATA 7-0 is connected to the 8-bit memory and/or I/O 17.

Figure 9:
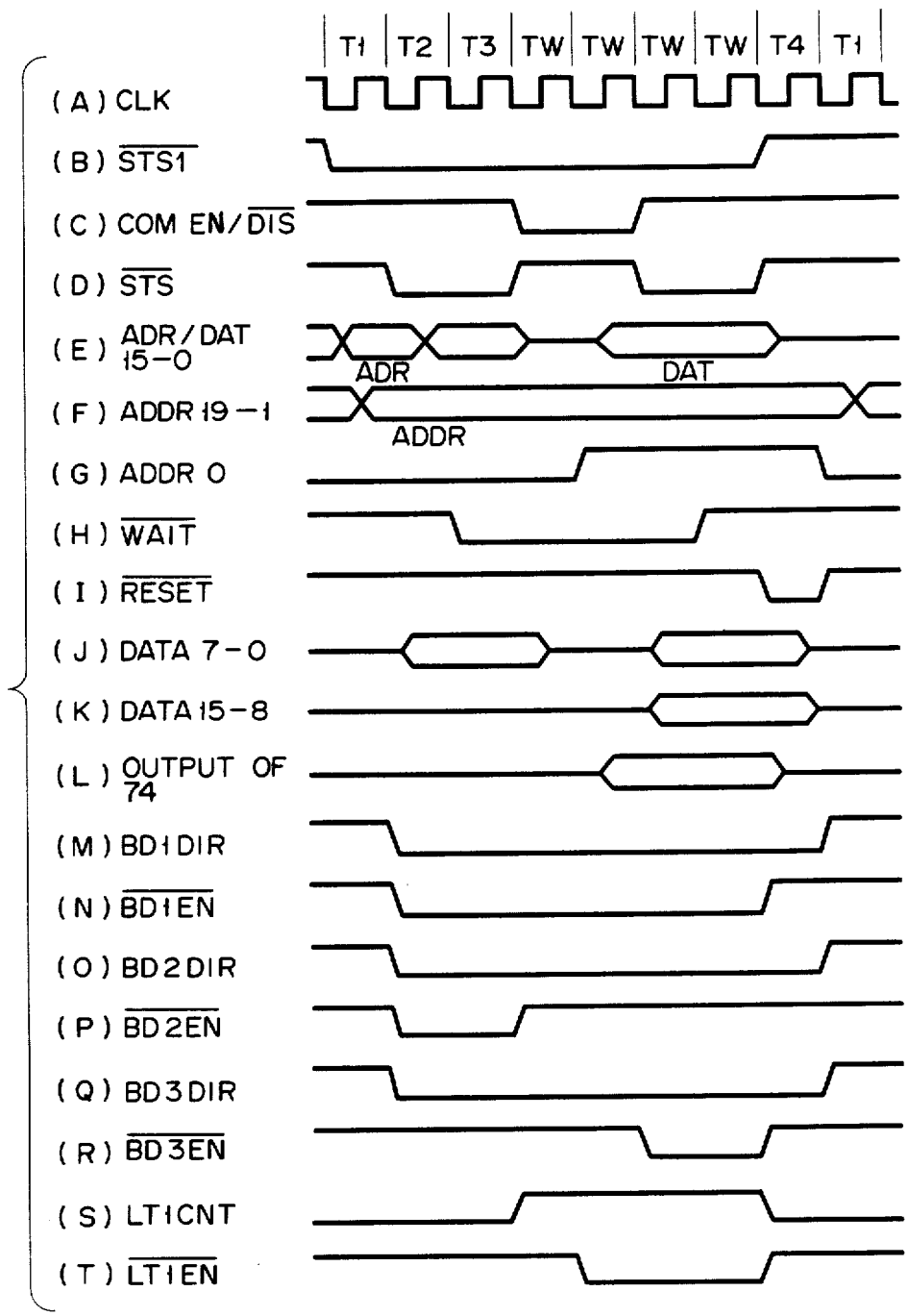
Figure 10:
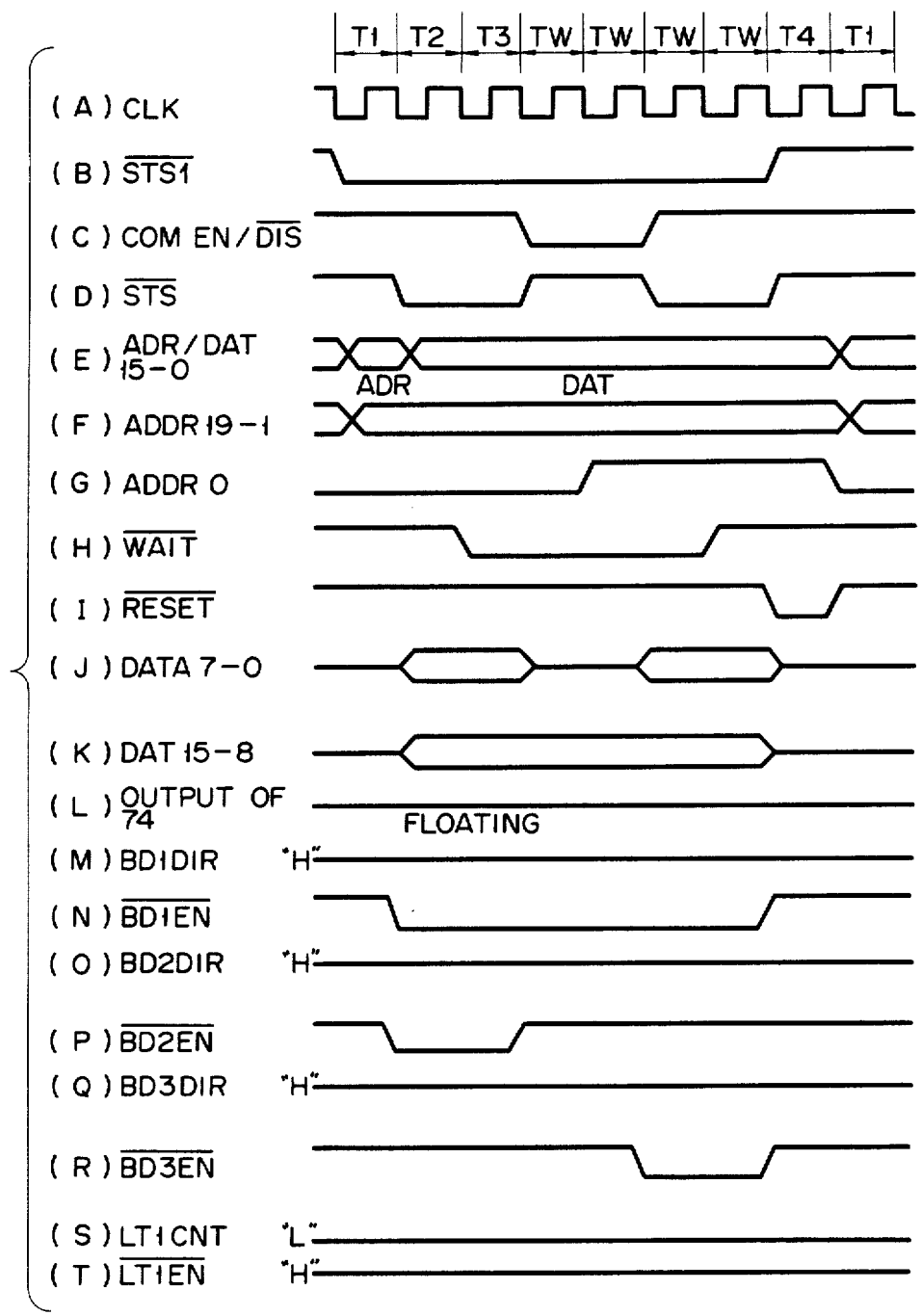
Figure 11:
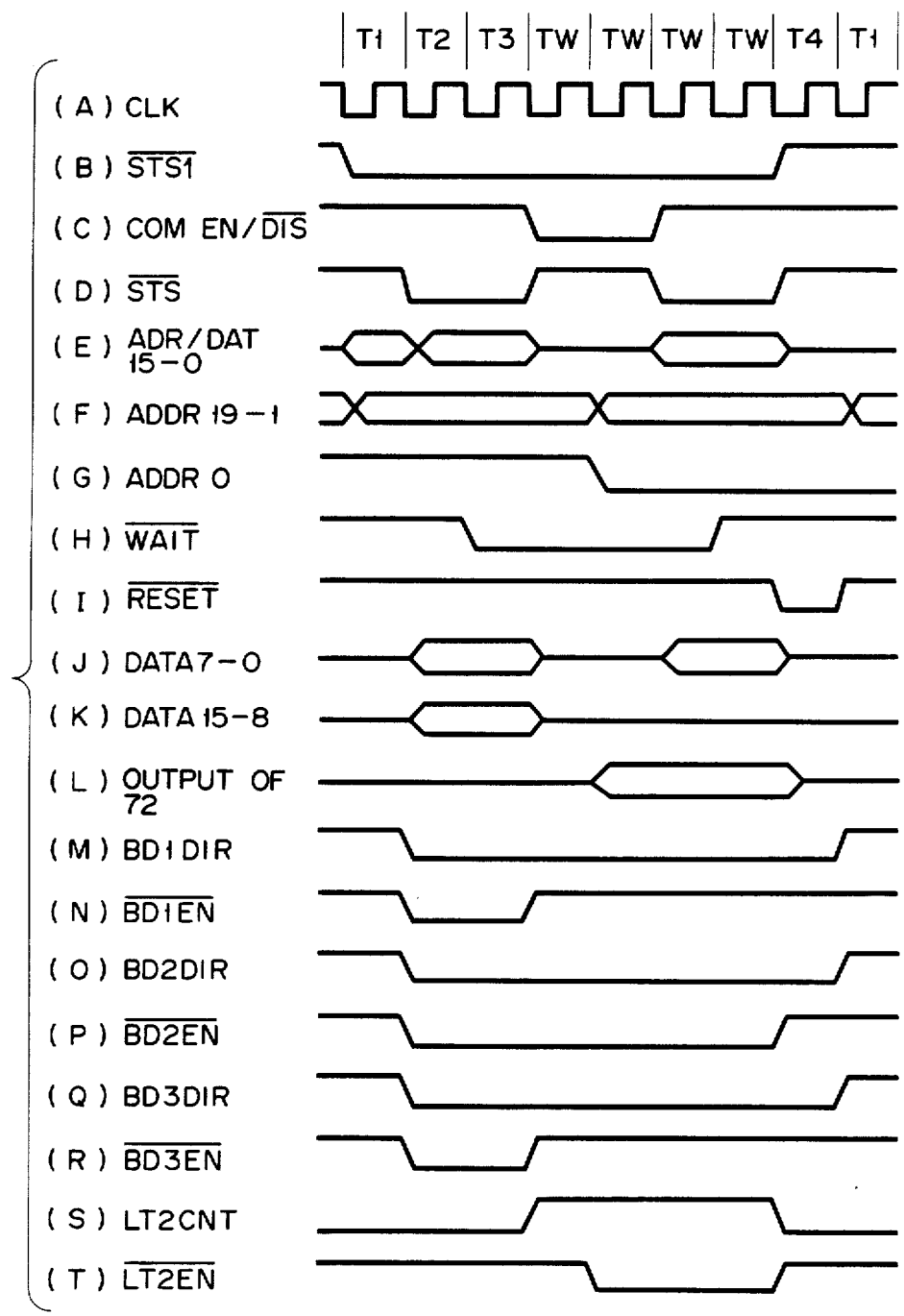

The operation of the microprocessor system of this embodiment will be described with reference to the timing charts of FIGS. 9A to 11T. At first a read cycle starting from an even address will be described with reference to FIGS. 9A to 9T. The clock signal CLK basically consists of clock pulses T1, T2, T3 and T4. When the microprocessor 11 is held in the wait state, the clock signal CLK is represented by TW. When the microprocessor 11 executes the word transfer instruction, it supplies the status $\overline{\text{STS1}}$ to the controller 12, as shown in FIG. 9B. The microprocessor 11 also supplies the address to the address latch counter 13, as shown in FIG. 9E. The counter 13 latches the address in response to an address latch enable signal ALE from the read/write controller 12, as shown in FIGS. 9F and 9G. As shown in FIG. 9C, since signal COM EN/$\overline{\text{DIS}}$ which disables a read/write control signal is not generated from the controller 21 at this moment, the controller 12 generates the signal $\overline{\text{STS}}$, as shown in FIG. 9D. Simultaneously, as if the instruction is a read instruction for the 16-bit memory and/or I/O 16, the controller 21 generates the bus control signals $\overline{\text{BD1EN}}$, BD1DIR, $\overline{\text{BD2EN}}$, BD2DIR, $\overline{\text{BD3EN}}$, BD3DIR, LT1CNT and $\overline{\text{LT1EN}}$ as shown in FIGS. 9M to 9T. Among these signals, the signals $\overline{\text{BD1EN}}$, $\overline{\text{BD2EN}}$, $\overline{\text{BD3EN}}$ and $\overline{\text{LT1EN}}$ are output enable/disable signals. The signals BD1DIR, BD2DIR and BD3DIR are output direction control signals. When one of the signals BD1DIR, BD2DIR or BD3DIR is set at a high level, the data is output from direction A to direction B illustrated in FIG. 8. However, the data is output from direction B to direction A when the signal BD1DIR, BD2DIR or BD3DIR is set at a low level. The signal LT1CNT is a latch timing control signal.

The drivers 71 and 73 are operated to supply data from the memories and/or I/Os 16 and 17 to the microprocessor 11. However, when the detector 19 detects, in accordance with the read/write control signal and the address, that the instruction is an instruction for the 8-bit memory and/or I/O 17, the detector 19 supplies the DET signal to the controller 21. The controller 21 then supplies the signal $\overline{\text{WAIT}}$ to the microprocessor 11, as shown in FIG. 9H, so as to set the microprocessor 11 in the wait state. As shown in FIG. 9E, the data from the memory and/or I/O 17 is sent onto the bus DAT 7-0 from DATA 7-0. However, the microprocessor 11 does not fetch data. As shown in FIG. 9S, the controller 21 supplies the signal LT1CNT to the latch 74, so that the data on the bus DATA 7-0 is latched by the latch 74. At the same time, the controller 21 supplies the signal $\overline{\text{BD2EN}}$ to the driver 73 to inhibit data output, as shown in FIG. 9P. As shown in FIG. 9C, the controller 21 supplies the signal COM EN/$\overline{\text{DIS}}$ to the controller 12 to inhibit generation of the signal $\overline{\text{STS}}$. As a result, as shown in FIG. 9D, the read/write control signal $\overline{\text{STS}}$ is disabled. The controller 21 supplies a signal of logic "1" to the counter 62. The counter 62 sends the updated address onto an address bus ADDR. As shown in FIG. 9T, the controller 21 supplies the signal $\overline{\text{LT1EN}}$ to the latch 74. The latch 74 sends the data onto the data bus DAT 7-0, as shown in FIG. 9L. The controller 21 supplies the signal COM EN/$\overline{\text{DIS}}$ to the controller 12 to enable generation of the read/out control signal $\overline{\text{STS}}$.

As shown in FIG. 9D, the signal $\overline{\text{STS}}$ is enabled again so that the second access cycle can be started. The driver 75 supplies the data read out from the memory and/or I/O 17 to the bus DATA 15-8 through the bus DATA 7-0, as shown in FIGS. 9J and 9K, in response to the signal $\overline{BD3EN}$ (FIG. 9R) from the controller 21. As shown in FIGS. 9M and 9N, the driver 71 sends the data from the bus DATA 15-8 onto the bus DAT 15-8 in response to the signal $\overline{BD1EN}$ from the controller 21. As shown in FIG. 9E, the 16-bit data appears on the bus DAT 15-0. In this case, the controller 21 generates the signal $\overline{WAIT}$, as shown in FIG. 9H, so that the wait state of the microprocessor 11 is cancelled. The microprocessor 11 fetches the 16-bit data and inhibits generation of the data $\overline{STS1}$, as shown in FIG. 9B. As a result, as shown in FIG. 9D, the signal $\overline{STS}$ is also inhibited. The pulser 53 supplies the signal $\overline{RESET}$ to the controller 21, as shown in FIG. 9I. The controller 21 resets the signals $\overline{BD1EN}$, $\overline{BD3EN}$, LT1CNT and $\overline{LT1EN}$, as shown in FIGS. 9N, 9R, 9S and 9T, respectively. Subsequently, the controller 21 resets the signals BD1DIR, BD2DIR and BD3DIR (FIGS. 9M, 9O and 9Q). In this manner, conversion operation is completed. In a read cycle starting with an even address, the latch 72 is kept disabled.

A write cycle starting with an even address will be described with reference to FIGS. 10A to 10T. In this case, the clock signal CLK, the data $\overline{STS1}$, the control signal COM EN/$\overline{DIS}$, the read/write control signal $\overline{STS}$, the control signal $\overline{WAIT}$ for the microprocessor 11, the reset signal $\overline{RESET}$ and the signal of logic "1" are the same as those of the read cycle starting with the even address. The signals associated with the converter 15 will be mainly considered in the following description. In the first access cycle, the drivers 71 and 73 are operated to supply 16-bit data to the memory and/or I/O 16, as shown in FIGS. 10M, 10N, 10O and 10P. Since the driver 75 is disabled, as shown in FIG. 10R, the driver 73 supplies data from the bus DAT 7-0 to the bus DATA 7-0, as shown in FIG. 10J. This data is transferred to the memory and/or I/O 17 through the bus DATA 7-0. In the second access cycle, the driver 71 is kept enabled, as shown in FIGS. 10M and 10N. However, the driver 73 is disabled, as shown in FIG. 10P. Instead, the driver 75 is enabled, as shown in FIG. 10R. For this reason, the most significant part of the 16-bit data generated from the microprocessor 11 is supplied by the drivers 71 and 75 to the memory and/or I/O 17 through the bus DATA 7-0, as shown in FIG. 10J. In the write cycle, the latches 72 and 74 are kept disabled. In this manner, the write cycle with the even address is executed.

A read cycle starting with an odd address will be described. In this case, the clock signal CLK, the data $\overline{STS1}$, the control signal COM EN/$\overline{DIS}$, the read/write control signal $\overline{STS}$, the control signal $\overline{WAIT}$ for the microprocessor 11, the reset signal $\overline{RESET}$ and the signal of logic "1" are the same as those of a read cycle starting with an even address. The signals associated with the converter 15 will be considered in the following description. The drivers 71 and 73 are operated to supply the 16-bit data from the memory and/or I/O 16 to the microprocessor 11, as shown in FIGS. 11M, 11N, 11O and 11P. In this case, when the instruction is determined to be a read cycle starting with an odd address, the converter 75 is held operative, as shown in FIGS. 11Q and 11R. In the first access cycle, the data (FIG. 11J) read out from the memory and/or I/O 17, and appearing on the bus DATA 7-0 is sent onto the bus DATA 15-8, as shown in FIG. 11K. The drivers 71 and 73 transfer the data from the bus DATA 15-0 to the bus DAT 15-0, as shown in FIG. 11E. The microprocessor 11 is held in the wait state, as shown in FIG. 11H, and does not fetch the data. The controller 21 supplies the signal LT2CNT to the latch 72, as shown in FIG. 11S, so that the latch 72 latches the data. The controller 21 supplies the signal $\overline{BD1EN}$ and $\overline{BD3EN}$ to the drivers 71 and 75, as shown in FIGS. 11N and 11R, to inhibit generation of data, and the signal $\overline{LT2EN}$ to the latch 72, as shown in FIG. 11T. As a result, the latch 72 sends the data onto the bus DAT 15-8, as shown in FIG. 11L. In the second access cycle, the driver 73 sends the data read out from the memory and/or I/O 17 onto the bus DAT 7-0, as shown in FIG. 11J. Therefore, as shown in FIG. 11E, the 16-bit data appears on the bus DAT 15-0. The wait state of the microprocessor 11 is cancelled in response to the signal $\overline{WAIT}$ from the controller 21, as shown in FIG. 11H, and the microprocessor 11 fetches the 16-bit data. In this manner, the read cycle starting with the odd address is completed. In the read cycle starting from the odd address, the latch 74 is kept disabled.

The output CYC from the counter 20 can be omitted when the controller 21 performs sequential operation. When a read/write word transfer instruction is performed for the memory and/or I/O 16 having the 16-bit data bus width, the operation is performed at timings as shown in FIGS. 2A to 2E.

The mode of operation of the microprocessor will be described when the word transfer instruction starting from the even address is performed and automatically converted to two byte transfer instructions. In this case, the microprocessor 11 comprises a 8086 available from Intel Corp. The latch 72 in the converter 15 can be omitted. A portion for controlling the latch 72 can also be omitted from the controller 21. The address latch counter 13 can be simplified, as shown in FIG. 12. The counter 13 comprises a latch 81 and a gate 82. The latch 81 latches the address from the microprocessor 11 and supplies the least significant bit thereof to the controller 21 and the gate 82. The remaining bits of the address are sent from the latch 81 onto an address bus ADDR 19-1. The gate 82 calculates a logical OR of the output from the latch 81 and the logic "1" from the controller 21 and generates the sum as the least significant bit of the address data. All bits of the address signal appear on the address but ADDR and are supplied to the memories and/or I/Os 16 and 17. The timing charts of this microprocessor system are the same as those of the word transfer instruction starting with an even address in FIGS. 9A to 10T.

The present invention is exemplified by a microprocessor system configured by connecting an 8-bit memory and/or I/O to a 16-bit microprocessor. However, when the address and data buses of the microprocessor system are expanded, a 16-bit memory and/or I/O may be connected to a 32-bit microprocessor, or a 32-bit memory and/or I/O may abe connected to a 64-bit microprocessor.

What is claimed is:
1. A microprocessor system comprising:
   microprocessor means, coupled to a first 2n-bit data bus and a first control bus, said first 2n-bit data bus including first and second data buses each having an n-bit data width, and responsive to an input 2n-bit data transfer command, for outputting a transfer instruction onto said first control bus, for selectively inputting into said microprocessor means 2n-bit input data on said first 2n-bit data bus, and for selectively outputting from said microprocessor means 2n-bit output data onto said first

2n-bit data bus, an operation state of said microprocessor means being held in accordance with a wait instruction input thereto;

read/write control means, coupled to said first control bus and a second control bus and responsive to the transfer instruction from said microprocessor means and a disable instruction input thereto, for selectively and sequentially generating and outputting onto said second control bus first and second transfer instructions, the first and second transfer instructions being associated with first and second transfer cycles, respectively;

bus converter means, coupled to said first 2n-bit data bus and a second 2n-bit data bus including third and fourth data buses and responsive to an input bus conversion instruction, for selectively and sequentially inputting into said bus converter means first n-bit input data ("FNID") and second n-bit input data ("SNID") on said third data bus, for substantially simultaneously outputting from said bus converter means the FNID and SNID as the 2n-bit input data onto said first 2n-bit data bus, for selectively inputting into said bus converter means the 2n-bit output data comprising first n-bit output data ("FNOD") and second n-bit output data ("SNOD") on said first 2n-bit data bus, and for sequentially outputting from said bus converter means the FNOD and the SNOD onto said third data bus;

a device having the n-bit data width, coupled to said third data bus and said second control bus and responsive to the first and second transfer instructions, for selectively and sequentially outputting from said device the FNID and SNID onto said third data bus, and for selectively and sequentially inputting into said device the FNOD and the SNOD on said third data bus; and timing generating means, coupled to said second control bus and responsive to the first and second transfer instructions from said read/write control means and an input address, for generating and outputting to said bus converter means the bus conversion instruction, for generating and outputting to said read/write control means the disable instruction between the first and second transfer cycles, and for generating and outputting to said microprocessor means the wait instruction from a first timing during the first transfer cycle to a second timing during the second transfer cycle.

2. The system according to claim 1, wherein said bus converter means comprises:

first transfer means, coupled to said first data bus and said third data bus, for selectively inputting into said first transfer means the FNID on said third data bus in accordance with an input first instruction to hold the FNID, for selectively outputting the held data onto said first data bus in accordance with an input second instruction, and for selectively transferring the FNOD from said first data bus onto said third data bus in accordance with an input third instruction;

second transfer means, coupled to said second data bus and said fourth data bus, for selectively transferring the SNID from said fourth data bus onto said second data bus in accordance with an input fourth instruction, and for selectively transferring the SNOD from said second data bus onto said fourth data bus in accordance with an input fifth instruction; and third transfer means, coupled to said third data bus and said fourth data bus, for selectively transferring one of the FNID and the SNID from said third data bus onto said fourth data bus in accordance with an input sixth instruction, and for selectively transferring the SNOD from said fourth data bus onto said third data bus in accordance with an input seventh instruction, and said timing generating means includes means responsive to the first and second transfer instructions and the address, for selectively generating one of a first set including the first instruction in the first transfer cycle and the second, fourth, and sixth instructions in the second transfer cycle and a second set including the third instruction in the first transfer cycle and the fifth and seventh instructions, and for outputting the generated set as the bus conversion instruction to said bus converter means.

3. The system according to claim 2, wherein said first transfer means further comprises means for selectively transferring the SNID from said third data bus onto said first data bus in accordance with an input eighth instruction, said second transfer means further comprises means for selectively inputting the FNID on said fourth data bus in accordance with an input ninth instruction to hold the FNID and for selectively outputting the held data onto said second data bus in accordance with an input tenth instruction, and said timing generating means includes means responsive to the first and second transfer instructions and a least significant bit of the address, for selectively generating one of a third set including the sixth and ninth instructions in the first transfer cycle and the eighth and tenth instructions in the second transfer cycle, and a fourth set including the fifth and seventh instructions in the first transfer cycle and the third instruction in the second transfer cycle.

4. The system according to claim 1, further comprising an address bus coupled to said device, and address latch counter means for latching the address from said microprocessor means in accordance with an input latch instruction and for outputting the latched address to said device and said timing generating means, and wherein said read/write control means further comprises means for generating the latch instruction in accordance with the transfer instruction from said microprocessor means to output the generated latch instruction to said address latch counter means.

5. The system according to claim 4, wherein said address latch counter means further comprises means for updating the latched address by one in accordance with an input update instruction and for outputting the updated address to said timing generating means and onto said address bus, and said timing generating means further comprises means for generating the update instruction between the first and second transfer cycles to output the generated instruction to said address latch counter means.

6. The system according to claim 5, wherein said address latch counter means comprises:

latch means for latching the address output from said microprocessor means in accordance with the latch instruction and for outputting the latched address onto said address bus; and counter means for updating the latched address by one in accordance with the update instruction and for outputting the updated address to said timing generating means and onto said address bus.

7. The system according to claim 5, wherein the FNID and the FNOD are associated with an even address, the SNID and the SNOD are associated with an odd address subsequent to the even address, and said address latch counter means comprises:
  latch means for latching the address output from said microprocessor means in accordance with the latch instruction and for outputting the latched address to said timing generating means and onto said address bus; and
  gate means for calculating logical OR of a least significant bit of the latched address and a bit indicated by the input update instruction and for outputting the latched address except for the least significant bit and the calculated bit.

8. The system according to claim 5, further comprising a second device having a 2n-bit data width and coupled to said second 2n-bit data bus, said second control bus, and said address bus, and wherein said timing generating means comprises detecting means for detecting whether or not the latched address from said address latch counter means addresses to said second device, means for inhibiting said timing generating means from generating the disable instruction, the wait instruction, and the update instruction, said read/write control means not generating the second transfer instruction, said address latch counter means not updating the latched address, and said microprocessor means being not held, and means for generating a second bus conversion instruction in accordance with the first transfer instruction when it is detected that the latched address addresses to said second device, and said bus converter means further comprises means responsive to an input second bus conversion instruction, for selectively transferring the 2n-bit output data from said first 2n-bit data bus onto said second 2n-bit data bus, and for selectively transferring the 2n-bit input data from said second 2n-bit data bus onto said first 2n-bit data bus.

9. A data transfer apparatus comprising:
  bus converter means, coupled to a first 2n-bit data bus including first and second data buses, each of said first and second data buses having an n-bit data width, and to a third data bus having the n-bit data width, and responsive to an input first conversion instruction, for selectively and sequentially inputting into said bus converter means first n-bit input data ("FNID") and second n-bit input data ("SNID") on said third data bus, and for substantially simultaneously outputting from said bus converter means the FNID and SNID as the 2n-bit input data onto said first 2n-bit data bus; and
  timing generating means, responsive to input first and second transfer instructions and an input address, the address being associated with the FNID and SNID, for generating and outputting to said bus converter means the first bus conversion instruction and for generating a disable instruction between first and second transfer cycles, the first and second transfer cycles being associated with the first and second transfer instructions, respectively;
  read/write control means, responsive to an input 2n-bit data transfer instruction and to the disable instruction input from said timing generating means, for selectively and sequentially generating and outputting to said timing generating means the first and second transfer instructions.

10. The apparatus according to claim 9, wherein said bus converter means comprises:
  first transfer means, coupled to said first data bus and said third data bus, for selectively inputting from said first transfer means the FNID on said third data bus in accordance with an input first instruction to hold the FNID and for selectively outputting the held data onto said first data bus in accordance with an input second instruction; and
  second transfer means, coupled to said second data bus and said third data bus, for selectively transferring the SNID from said third data bus onto said second data bus in accordance with an input third instruction, and
  said timing generating means includes means, responsive to the first and second transfer instructions and the address, for selectively generating the first conversion instruction including the first instruction in the first transfer cycle and the second and third instructions in the second transfer cycle and for outputting the first conversion instruction to said bus converter means.

11. The apparatus according to claim 9, wherein said bus converter means comprises:
  third transfer means, coupled to said second data bus and said third data bus, for selectively inputting into said third transfer means the FNID on said third data bus in accordance with an input fourth instruction to hold the FNID and for selectively outputting the held data onto said second data bus in accordance with an input fifth instruction; and
  fourth transfer means, coupled to said first data bus and said third data bus, for selectively transferring the SNID from said third data bus onto said first data bus in accordance with an input sixth instruction, and
  said timing generating means includes means, responsive to the first and second transfer instructions and the address, for selectively generating the first conversion instruction including the fourth instruction in the first transfer cycle and the fifth and sixth instructions in the second transfer cycle and for outputting the first conversion instruction to said bus converter means.

12. The apparatus according to claim 9, wherein said bus converter means further comprises first means for selectively and sequentially transferring 2n-bit output data including first n-bit output data ("FNOD") on said first data bus and second n-bit output data ("SNOD") on said second data bus, in units of the n-bit data in accordance with an input second conversion instruction; and
  said timing generating means further comprises second means for selectively generating the second conversion instruction in accordance with the first and second transfer instructions to output the generated instruction to said bus conversion means.

13. The apparatus according to claim 12, wherein said first means comprises:
  fifth transfer means, coupled to said first data bus and said third data bus, for selectively transferring the FNOD from said first data bus onto said third data bus in accordance with an input seventh instruction; and
  sixth transfer means, coupled to said second data bus and said third data bus, for selectively transferring the SNOD from said second data bus onto said third data bus in accordance with an input eighth instruction, and said timing generating means includes means, responsive to the first and second transfer instructions and an input second address, the second address being associated with the FNOD and SNOD, for selectively generating the second conversion instruction including the seventh instruction in the first transfer cycle and the eighth instruction in the second transfer cycle, and for outputting the first conversion instruction to said bus converter means.

14. The apparatus according to claim 12, wherein said first means comprises:

fifth transfer means, coupled to said first data bus and said third data bus, for selectively transferring the FNOD from said first data bus onto said third data bus in accordance with an input seventh instruction; and sixth transfer means, coupled to said second data bus and said third data bus, for selectively transferring the SNOD from said second data bus onto said third data bus in accordance with an input eighth instruction, and said timing generating means includes means, responsive to the first and second transfer instructions and the second address, for selectively generating the second conversion instruction including the eighth instruction in the first transfer cycle and the seventh instruction in the second transfer cycle, and for outputting the first conversion instruction to said bus converter means.

15. The apparatus according to claim 9, wherein said bus converter means further comprises third means, responsive to an input third conversion instruction, for selectively inputting into said bus converter means 2n-bit output data on said first 2n-bit data bus, for holding one of FNOD and SNOD of 2n-bit output data, for selectively transferring the other of the FNOD and SNOD onto said third data bus, and for outputting the held data onto said third data bus; and timing generating means further comprises fourth means, responsive to input first and second transfer instructions and the second address, for generating and outputting to said bus converter means the third bus conversion instruction to output the generated instruction to said bus converter means.

16. The apparatus according to claim 15, wherein said third means comprises:

seventh transfer means, coupled to said second data bus and said third data bus, for selectively inputting into said seventh transfer means the SNOD on said second data bus in accordance with an input ninth instruction to hold the SNOD and for selectively outputting the held data onto said first data bus in accordance with an input tenth instruction; and eighth transfer means, coupled to said first data bus and said third data bus, for selectively transferring the FNOD from said first data bus onto said third data bus in accordance with an input eleventh instruction, and said timing generating means includes means, responsive to the first and second transfer instructions and the second address, for selectively generating the third conversion instruction including the ninth and eleventh instructions in the first transfer cycle and the tenth instruction in the second transfer cycle and for outputting the first conversion instruction to said bus converter means.

17. The apparatus according to claim 15, wherein said third means comprises:

ninth transfer means, coupled to said first data bus and said third data bus, for selectively inputting into said ninth transfer means the FNOD on said first data bus in accordance with an input twelfth instruction to hold the FNOD and for selectively outputting the held data onto said first data bus in accordance with an input thirteenth instruction; and tenth transfer means, coupled to said first data bus and said third data bus, for selectively transferring the SNOD from said second data bus onto said third data bus in accordance with an input fourteenth instruction, and said timing generating means includes means, responsive to the first and second transfer instructions and the second address, for selectively generating the third conversion instruction including the twelfth and fourteenth instructions in the first transfer cycle and the thirteenth instruction in the second transfer cycle and for outputting the first conversion instruction to said bus converter means.

18. A method of applying a 2n-bit data transfer instruction to a device having an n-bit data bus width, said method comprising the steps of:

performing a first access cycle and selectively performing a second access cycle, in accordance with the 2n-bit data transfer instruction and first and second addresses;

sequentially transferring first n-bit output data ("FNOD") and second n-bit output date ("SNOD") constituting 2n-bit output data on a first 2n-bit data bus to the device through a n-bit data bus to which the device is coupled, in the first and second access cycles, respectively; and holding first n-bit input data ("FNID") on the n-bit data bus to output the held data to the 2n-bit data bus together with second n-bit input data ("SNID") on the n-bit data bus, as a 2n-bit input data, the FNID and the SNID being output from the device onto the n-bit data bus in the first and second access cycles, respectively, and the first and second access addresses being associated with the FNOD and SNOD or the FNID and SNID.

19. The method according to claim 18 further comprising the steps of:

holding a microprocessor, which is coupled to the 2n-bit data bus, in a wait state before the first access cycle is completed and releasing the microprocessor from the wait state before the second access cycle is completed, the microprocessor generating the 2n-bit data transfer instruction in response to an input 2n-bit data transfer command, selectively outputting the 2n-bit output data onto the 2n-bit data bus, and selectively inputting the 2n-bit input data from the 2n-bit data bus.

20. The method according to claim 19 further comprising the steps of:

latching the first access address from the microprocessor to output the latched first access address to the device and selectively updating the latched first access address between the first and second access cycles to output the updated address as the second access address to the device.

* * * * *